US011545535B2

(12) United States Patent
Ban (10) Patent No.: US 11,545,535 B2
(45) Date of Patent: Jan. 3, 2023

(54) STRETCHABLE DISPLAY PANEL AND DISPLAY DEVICE

(71) Applicant: BOE Technology Group Co., Ltd., Beijing (CN)

(72) Inventor: Shengguang Ban, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 177 days.

(21) Appl. No.: 17/040,485

(22) PCT Filed: Mar. 23, 2020

(86) PCT No.: PCT/CN2020/080711
§ 371 (c)(1),
(2) Date: Sep. 22, 2020

(87) PCT Pub. No.: WO2020/192634
PCT Pub. Date: Oct. 1, 2020

(65) Prior Publication Data
US 2021/0143243 A1     May 13, 2021

(30) Foreign Application Priority Data
Mar. 25, 2019  (CN) .......................... 201910225961.5

(51) Int. Cl.
*H01L 27/32* (2006.01)
*H01L 51/00* (2006.01)
*H01L 51/56* (2006.01)

(52) U.S. Cl.
CPC ...... *H01L 27/3276* (2013.01); *H01L 51/0097* (2013.01); *H01L 51/56* (2013.01); *H01L 2227/323* (2013.01); *H01L 2251/5338* (2013.01)

(58) Field of Classification Search
None
See application file for complete search history.

(56) References Cited

U.S. PATENT DOCUMENTS

2015/0356926 A1    12/2015  Bae
2016/0268352 A1*   9/2016  Hong .................. H01L 27/3223
(Continued)

FOREIGN PATENT DOCUMENTS

CN         101185175 A     5/2008
CN         105140259 A    12/2015
(Continued)

OTHER PUBLICATIONS

CN201910225961.5 OA1.

*Primary Examiner* — J. E. Schoenholtz
(74) *Attorney, Agent, or Firm* — IPro, PLLC (57) ABSTRACT

The present disclosure provides a stretchable display panel and a display device. The stretchable display panel includes: a flexible substrate which is divided into a plurality of display areas and non-display areas located between the display areas; wherein the display areas include light-emitting devices and driving circuits coupled to the light-emitting devices; and the non-display areas include wiring areas and a plurality of opening areas located between the wiring areas, the wiring areas include wires coupled to the driving circuits, and the opening areas are of a hollow structure. The plurality of opening areas are formed in the non-display areas, and the flexible substrate in the opening areas is of a hollow structure, that is, no film layer is reserved in the opening areas, thus when the display panel is stretched, the display panel can be stretched in any direction, and the stretching effect of the display panel is improved.

15 Claims, 5 Drawing Sheets

(56) References Cited

U.S. PATENT DOCUMENTS

| | | | |
|---|---|---|---|
| 2017/0294495 A1 | 10/2017 | Shyu et al. | |
| 2018/0052493 A1 | 2/2018 | Hong et al. | |
| 2019/0107911 A1* | 4/2019 | Zhai | G06F 3/0443 |
| 2019/0267558 A1 | 8/2019 | Wang et al. | |
| 2020/0105170 A1 | 4/2020 | Dai et al. | |
| 2020/0258951 A1 | 8/2020 | Hong et al. | |
| 2022/0061154 A1* | 2/2022 | Keum | H01L 27/3276 |

FOREIGN PATENT DOCUMENTS

| | | | |
|---|---|---|---|
| CN | 105977276 A | 9/2016 | |
| CN | 108831893 A | 11/2018 | |
| CN | 109189265 A | 1/2019 | |
| CN | 109192858 A | 1/2019 | |
| CN | 109308851 A | 2/2019 | |
| CN | 109427818 A | 3/2019 | |
| CN | 109920803 A | 6/2019 | |
| WO | 2006129223 A1 | 12/2006 | |
| WO | 2020057055 A1 | 3/2020 | |

* cited by examiner

STRETCHABLE DISPLAY PANEL AND DISPLAY DEVICE

CROSS-REFERENCE TO RELATED APPLICATION

The present disclosure is a US National Stage of International Application No. PCT/CN2020/080711, filed Mar. 23, 2020, which claims the priority of a Chinese patent application filed to the Chinese Patent Office on Mar. 25, 2019, No. 201910225961.5 and entitled Stretchable Display Substrate and Display Device, the entire content of which is incorporated into the present disclosure by reference.

FIELD

The present disclosure relates to the field of display, in particular to a stretchable display panel and a display device.

BACKGROUND

Flexible display panels have received more and more attention due to their advantages such as foldability, portability and a wide application range, especially the stretchable display panels, which bring users a brand-new viewing and use experience. The stretching performance of existing stretchable display panels cannot meet needs of people, which limits the application of stretchable flexible display panels.

SUMMARY

An embodiment of the present disclosure provides a stretchable display panel including: a flexible substrate including display areas and non-display areas located between the display areas, wherein each non-display area includes wiring areas and opening areas located between the wiring areas, and each opening area includes structure hollow structure penetrating through the stretchable display panel in a thickness direction; a plurality of sub-pixels located in the display areas, wherein each sub-pixel includes a light-emitting device and a driving circuit coupled to the light-emitting device; and a plurality of wires located in the wiring areas and coupled to the driving circuits.

Optionally, in the stretchable display panel provided by the embodiment of the present disclosure, the wires include first wires and second wires, two adjacent display areas in a column are coupled by the first wires, and two adjacent display areas in a row are coupled by the second wires.

Optionally, in the stretchable display panel provided by the embodiment of the present disclosure, two first sides of the two adjacent display areas in a column are adjacent to each other, and the first wires are coupled to the other sides of the two adjacent display areas in a column except the two first sides; and two second sides of the two adjacent display areas in a row are adjacent to each other, and the second wires are coupled to the other sides of the two adjacent display areas in a row except the two second sides.

Optionally, in the stretchable display panel provided by the embodiment of the present disclosure, the first wires are coupled to sides opposite to the first sides in the two adjacent display areas in a column, and the second wires are coupled to sides opposite to the second sides in the two adjacent display areas in a row.

Optionally, in the stretchable display panel provided by the embodiment of the present disclosure, the wiring areas include first wiring areas and second wiring areas, areas where the first wires coupled to the two adjacent display areas in a column are located are the first wiring areas, and areas where the second wires coupled to the two adjacent display areas in a row are located are second wiring areas; and the first wiring areas corresponding to the display areas in two adjacent columns are arranged symmetrically, and the second wiring areas corresponding to the display areas in two adjacent rows are arranged symmetrically.

Optionally, in the stretchable display panel provided by the embodiment of the present disclosure, the opening areas include first opening areas and second opening areas, the first opening areas are formed between two adjacent first wiring areas in a row, and the second opening areas are formed between two adjacent second wiring areas in a column.

Optionally, in the stretchable display panel provided by the embodiment of the present disclosure, the first opening areas extend to areas between the first wiring areas and the adjacent second wiring areas and form "H"-shaped opening areas, and the second opening areas extend to areas between the second wiring areas and the adjacent first wiring areas and form "H"-shaped opening areas.

Optionally, in the stretchable display panel provided by the embodiment of the present disclosure, among every two adjacent "H"-shaped opening areas in a row direction and/or a column direction, one of the "H"-shaped opening areas is arranged in a vertical direction, and the other "H"-shaped opening area is arranged in a horizontal direction.

Optionally, in the stretchable display panel provided by the embodiment of the present disclosure, the "H"-shaped opening areas in the vertical direction and the "H"-shaped opening areas in the horizontal direction are alternately arranged in the row direction and/or the column direction.

Optionally, in the stretchable display panel provided by the embodiment of the present disclosure, the non-display areas further include isolation areas which are located between the wiring areas and the opening areas and surround the opening areas, and light-emitting functional layers included in light-emitting devices are disconnected at edges of the isolation areas.

Optionally, in the stretchable display panel provided by the embodiment of the present disclosure, each isolation area includes a barrier layer, a conductive part and a planarization layer which are sequentially stacked on the flexible substrate; and in a direction where the isolation areas point to the opening areas, a width of an orthographic projection of each conductive part on the flexible substrate is smaller than a width of an orthographic projection of each planarization layer on the flexible substrate.

Optionally, in the stretchable display panel provided by the embodiment of the present disclosure, in the direction where the isolation areas point to the opening areas, the width of the orthographic projection of the each conductive part on the flexible substrate is smaller than a width of an orthographic projection of each barrier layer on the flexible substrate.

Optionally, in the stretchable display panel provided by the embodiment of the present disclosure, each wiring area includes a barrier layer, wires and a planarization layer which are sequentially stacked on the flexible substrate; and each conductive part is arranged in the same layer as the wires.

Optionally, in the stretchable display panel provided by the embodiment of the present disclosure, in the areas between the display areas and the wiring areas as well as between the wiring areas and the isolation areas, all film layers are not patterned and only the flexible substrate exists.

An embodiment of the present disclosure further provides a display device which includes the above-mentioned stretchable display panel provided by the embodiments of the present disclosure.

DETAILED DESCRIPTION OF THE EMBODIMENTS

In order to make the objectives, technical solutions and advantages of the present disclosure clearer, specific implementation modes of a stretchable display panel and a display device which are provided by the embodiments of the present disclosure are described in detail below with reference to the accompanying drawings.

The thickness and shape of each film in the accompanying drawings do not reflect the true ratio of the stretchable display panel, and are only intended to illustrate the present disclosure.

Figure 1:
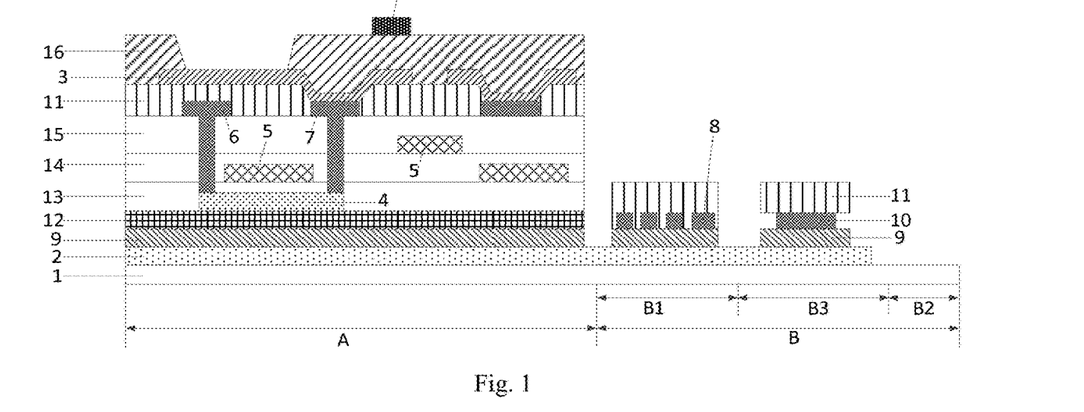
FIG. 1 is a schematic cross-sectional structural diagram of a stretchable display panel provided by an embodiment of the present disclosure.
Figure 2:
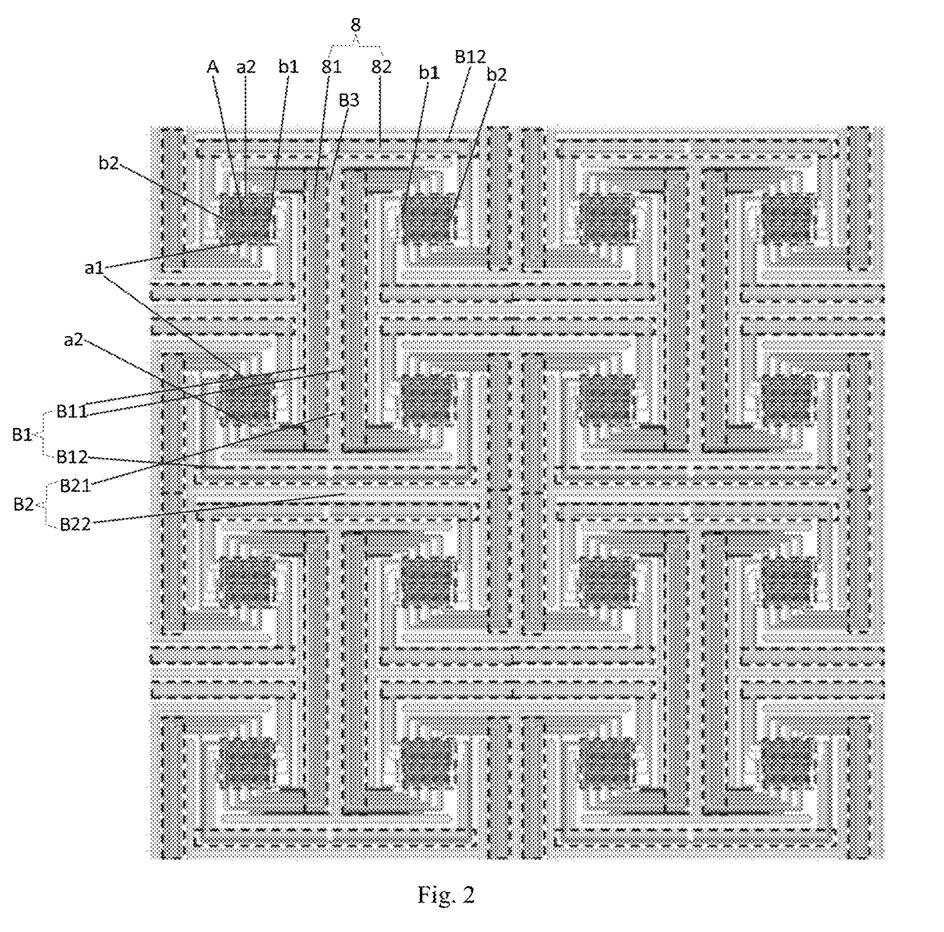
FIG. 2 is a top view of a schematic structural diagram of a stretchable display panel provided by an embodiment of the present disclosure.

A stretchable display panel provided by an embodiment of the present disclosure, as shown in FIG. 1, includes: a flexible substrate 2 divided into display areas A and non-display areas B located between the display areas A, where only one display area A and one non-display area B are shown in FIG. 1, and FIG. 2 illustrates a case of a plurality of display areas A arranged in an array; and each non-display area B includes wiring areas B1 and opening areas B2 located between the wiring areas B1, and the opening areas B2 are provided with one or more hollow structures penetrating through the stretchable display panel in the thickness direction, that is, any film layer and the flexible substrate 2 are not reserved in the opening areas B2; a plurality of sub-pixels located in the display areas A; wherein each sub-pixel includes a light-emitting device and a driving circuit coupled to the corresponding light-emitting device; each light-emitting device generally includes an anode 3, a cathode and a light-emitting functional layer located between the corresponding anode and the corresponding cathode, in FIG. 1, only the anode 3 is shown, and the light-emitting functional layer and the cathode are not shown; each driving circuit includes a thin film transistor, each thin film transistor generally includes an active layer 4, gates 5, a source 6 and a drain 7 on the flexible substrate 2, the structure of a top-gate thin film transistor is taken as an example for illustration in FIG. 1, and in practical applications, the structure of a bottom-gate thin film transistor can also be adopted, which is not limited herein; and a plurality of wires 8 located in the wiring areas B1 and coupled to the driving circuits, wherein the wires 8 are configured to connect the adjacent display areas A.

Specifically, in the above-mentioned stretchable display panel provided by the embodiments of the present disclosure, by forming the opening areas B2 between the wiring areas B1 of the non-display areas B, and providing the opening areas B2 with the hollow structures, that is, any film layer is not reserved in the opening areas B2, in this way, when the display panel is stretched, the display panel can be stretched in any direction, and the stretching effect of the display panel is improved.

It should be noted that all the film layers on the display panel are perforated in the opening areas B2, that is, the parts from an uppermost spacer layer 17 to the lowermost flexible substrate 2 are all perforated, and no film layer is arranged to provide corresponding spaces for deformation during the stretching process. Generally, during production, the display panel is carried on a rigid substrate 1 as shown in FIG. 1 for the production of the film layers, and the display panel needs to be peeled off from the rigid substrate 1 after the production is completed.

During specific implementation, in the above-mentioned stretchable display panel provided by the embodiments of the present disclosure, the flexible substrate 2 may be made of materials such as PI.

During specific implementation, in the above-mentioned stretchable display panel provided by the embodiment of the present disclosure, one display area A includes a plurality of sub-pixels, such as red sub-pixels, green sub-pixels and blue sub-pixels. Each display area A in the embodiment of the present disclosure includes 2×2 sub-pixels, and may also include more sub-pixels, and film layers in the sub-pixels are of similar structures to those of film layers of existing OLED, which are not described in detail herein.

Optionally, during specific implementation, in the above-mentioned stretchable display panel provided by the embodiment of the present disclosure, as shown in FIG. 2, the wires 8 may include first wires 81 and second wires 82, every two adjacent display areas A in a column are coupled by the corresponding first wire 81, and every two adjacent display areas A in a row are coupled by the corresponding second wire 82; that is, the longitudinal display areas A are coupled through the first wires 81, and the transversely adjacent display areas A are coupled by the second wires 82. Specifically, the first wires 81 may specifically be wires needing to be vertically arranged, such as data lines and power signal lines, and the second wires 82 may specifically be wires needing to be transversely arranged, such as gate lines and scan lines.

Optionally, during specific implementation, in the above-mentioned stretchable display panel provided by the embodiment of the present disclosure, as shown in FIG. 2, every two adjacent display areas A in a column are provided with two adjacent first sides a1, and the first sides a1 may be considered as the closest two opposite sides between the longitudinally adjacent display areas A; the first wires 81 connect the two adjacent display areas A in a column through other sides except the first sides a1, that is, the first wires 81 are coupled to the other sides of the two adjacent display areas A in a column except the first sides a1; and the above arrangement ensures that the first wires 81 between the longitudinally adjacent display areas A are polylines, and the breakage risk of the first wires 81 during the longitudinal stretching process of the display panel can be lowered; and every two adjacent display areas A in a row are provided with two adjacent second sides b1, and the second sides b1 can be considered as the closest two opposite sides between the transversely adjacent display areas A; the second wires 82 connect the two adjacent display areas A in a row through other sides except the second sides b1, that is, the second wires 82 are coupled to the other sides of the two adjacent display areas A in a row except the second sides b1, the above arrangement ensures that the second wires 82 between the transversely adjacent display areas A are polylines, and the breakage risk of the second wires 82 during the transverse stretching process of the display panel can be lowered.

Optionally, during specific implementation, in the above-mentioned stretchable display panel provided by the embodiment of the present disclosure, as shown in FIG. 2, the first wires 81 may be coupled to sides a2 opposite to the first sides a1 in two adjacent display areas in a column, the above arrangement ensures that the first wires 81 between the longitudinally adjacent display areas A are polylines, which can lower the breakage risk of the first wires 81 during the longitudinal stretching process of the display panel; and correspondingly, the second wires 82 are coupled to sides b2 opposite to the second sides b1 in the two adjacent display areas A in a row, the above arrangement ensures that the second wires 82 between the transversely adjacent display areas A are polylines, which can lower the breakage risk of the second wires 82 during the transverse stretching process of the display panel. Moreover, the above arrangement is also convenient to ensure that "H"-shaped opening areas B2 are formed between the wiring areas B1 to improve the stretching effect of the display panel, and the specific shape of the opening areas B2 will be introduced later.

Optionally, during specific implementation, in the above-mentioned stretchable display panel provided by the embodiment of the present disclosure, as shown in FIG. 2, the wiring areas B1 may include first wiring areas B11 and second wiring areas B12, areas where the first wires 81 coupled to the two adjacent corresponding display areas A in a column are located are the first wiring areas B11, and areas where the second wires 82 coupled to the two adjacent corresponding display areas A in a row are located are second wiring areas B12; and the first wiring areas B11 corresponding to the display areas A in two adjacent columns are arranged symmetrically, that is, the first wiring areas B11 are mirrored along the longitudinal center axis, and the second wiring areas B12 corresponding to the display areas A in two adjacent rows are arranged symmetrically, that is, the second wiring areas B12 are mirrored along the transverse central axis. The above-mentioned distribution mode of the first wiring areas B11 and the second wiring areas B12 is convenient for arranging the opening areas B2 with high stretch deformation ability, and can ensure that load of each first wire 81 is uniform, and load of each second wire 82 is uniform as much as possible.

Optionally, during specific implementation, in the above-mentioned stretchable display panel provided by the embodiment of the present disclosure, as shown in FIG. 2, the opening areas B2 may include first opening areas B21 and second opening areas B22, the first opening areas B21 are formed between two adjacent first wiring areas B11 in a row, and the second opening areas B22 are formed between two adjacent second wiring areas B12 in a column. Specifically, it can be considered that the first opening areas B21 extend in the longitudinal direction, and the second opening areas B22 extend in the transverse direction, that is, there are opening areas in the transverse direction and opening areas in the longitudinal direction in the display panel, which is beneficial to enhance the stretch stability of the display panel in all directions.

Optionally, during specific implementation, in order to improve the maximum stretching amount of the display panel and the stability of the display panel after repeated stretching, in the above-mentioned stretchable display panel provided by the embodiment of the present disclosure, as shown in FIG. 2, the first opening areas B21 may extend to areas between the first wiring areas B11 and the adjacent second wiring areas B12 and form "H"-shaped opening areas, that is, main bodies of the first opening areas B21 extend in the longitudinal direction, and the two ends of the main bodies extend in the transverse direction, which can ensure that the first opening areas B21 are stretched in multiple directions when the display panel is stretched in multiple directions; similarly, the second opening areas B22 may extend to areas between the second wiring areas B12 and the adjacent first wiring areas B11, and form "H"-shaped opening areas, that is, main bodies of the second opening areas B22 extend in the transverse direction, and the two ends of the main bodies extend in the longitudinal direction, which can ensure that the second opening areas B22 are stretched in multiple directions when the display panel is stretched in multiple directions.

Optionally, during specific implementation, in order to further improve the stretching effect of the display panel, in the above-mentioned stretchable display panel provided by the embodiment of the present disclosure, as shown in FIG. 2, among every two adjacent "H"-shaped opening areas in the row direction and/or the column direction, one of the "H"-shaped opening areas is arranged in the vertical direction, and the other "H"-shaped opening area is arranged in the horizontal direction.

Optionally, during specific implementation, in the above-mentioned stretchable display panel provided by the embodiment of the present disclosure, as shown in FIG. 2, the "H"-shaped opening areas in the vertical direction and the "H"-shaped opening areas in the horizontal direction are alternately arranged in the row direction and/or the column direction. In this way, when the display panel is stretched, the stretching effect is better achieved.

Optionally, during specific implementation, since holes of the opening areas B2 are formed around each display area A in the solution provided by the embodiment of the present disclosure, the peripheries of the light-emitting functional layers of the light-emitting devices located in the display areas A may be in contact with air through the holes, so it is necessary to package each display area A at the pixel level. Based on this, in the above-mentioned stretchable display panel provided by the embodiment of the present disclosure, as shown in FIGS. 1 and 2, the non-display areas B may further include isolation areas B3 which are located between the wiring areas B1 and the opening areas B2 and surround the opening areas B2, then the light-emitting functional layers can be disconnected at the edges of the isolation areas B3 to achieve the purpose of blocking the transmission of water and oxygen, and therefore the packaging effect is enhanced.

Specifically, in the above-mentioned stretchable display panel provided by the embodiment of the present disclosure, as shown in FIG. 1, each isolation area B3 at least includes a barrier layer 9, a conductive part 10 and a planarization layer 11 which are sequentially stacked on the flexible substrate 2; and in the direction where the isolation areas B3 point to the opening areas B2, the width of the orthographic projection of each conductive part 10 on the flexible substrate 2 is smaller than the width of the orthographic projection of each planarization layer 11 on the flexible substrate 2, so that an inverted trapezoidal isolation pillar is formed, the light-emitting functional layers can be prevented from contacting the opening areas B2 by designing the isolation pillars around the opening areas B2 to achieve the purpose of blocking the transmission of water and oxygen.

Further, during specific implementation, in the above-mentioned stretchable display panel provided by the embodiment of the present disclosure, as shown in FIG. 1, in the direction where the isolation areas B3 point to the opening areas B2, the width of the orthographic projection of each conductive part 10 on the flexible substrate 2 may be smaller than the width of the orthographic projection of each barrier layer 9 on the flexible substrate 2 to increase the disconnection degree of the light-emitting functional layers at the edges of the inverted trapezoidal isolation pillars, then the organic light-emitting layers can be prevented from contacting the opening areas B2 by designing the isolation pillars around the opening areas B2 to achieve the purpose of blocking the transmission of water and oxygen.

Specifically, in the above-mentioned stretchable display panel provided by the embodiments of the present disclosure, in order to improve the deformability of the wiring areas B1, as shown in FIG. 1, each wiring area B1 may include a barrier layer 9, wires 8 and a planarization layer 11 which are sequentially stacked on the flexible substrate 2, and the inorganic and metal structure has high deformability. Moreover, the conductive parts 10 can be arranged in the same layer as the wires 8, so that only original patterning patterns need to be changed when the wires 8 are formed, and the patterns of the conductive parts 10 and the wires 8 can be formed by a one-time patterning process without adding the process of preparing the conductive parts 10 separately, the preparation process can be simplified, the production cost is reduced, and the production efficiency is improved.

Specifically, in the above-mentioned stretchable display panel provided by the embodiment of the present disclosure, as shown in FIG. 1, in the areas between the display areas A and the wiring areas B1 as well as between the wiring areas B1 and the isolation areas B3, all the film layers are not patterned and only the flexible substrate 2 exists, and thus the stretching performance of the display panel can be improved through the structural design.

During specific implementation, in order to ensure that the light-emitting functional layers can be disconnected at the isolation pillar structures formed in the isolation areas B3, the distances from the isolation areas B3 to the wiring areas B1 and the opening areas B2 may range from 3 μm to 8 μm respectively.

During specific implementation, the size of each display area A may range from 200 μm to 400 μm, the width of the wiring areas B1 may range from 60 μm to 100 μm, the width of the opening areas B2 may range from 10 μm to 30 μm, and the width of the isolation areas B3 may range from 2 μm to 8 μm.

During specific implementation, in view of the stretching performance, the wires in the wiring areas B1 may all adopt Ti/Al/Ti metal. In order to complete the arrangement of the wires, Ti/Al/Ti metal may be arranged in two layers, 4 wires are distributed in each layer, and the width of each wire may range from 6 μm to 15 μm, and the gap between the wires may range from 5 μm to 15 μm.

During specific implementation, no wire is arranged at the edges of the wiring areas B1, that is, spaces need to be reserved between the wires and the edges of the wiring areas B1 to provide spaces for the isolation areas B3.

Optionally, during specific implementation, in the above-mentioned stretchable display panel provided by the embodiment of the present disclosure, as shown in FIG. 1, each display area A may further include: a buffer layer 12 located on the barrier layer 9, and a gate insulating layer 13 located between the active layer 4 and the corresponding gate 5. The thin film transistors adopted in the embodiment of the present disclosure are of a double gate structure. Each display area A further includes a first insulating layer 14 located between the two gates 5, a second insulating layer 15 located among the corresponding gate 5, the source 6 and the drain 7, and a planarization layer 11 located among the source 6, the drain 7 and the anode 3, and the anode 3 is coupled to the drain 7 through a via hole of the planarization layer 11. Each display area A may further include a pixel defining layer 16 which is located on the anode 3 and defines the light-emitting devices of the sub-pixels, and a spacer layer 17 located on the pixel defining layer 16; and during specific implementation, the display panel provided by the embodiment of the present disclosure also includes other functional film layers well known in the art, which are not described in detail herein.

Taking the structure shown in FIG. 1 as an example, a manufacturing method of the stretchable display panel provided by the embodiments of the present disclosure is described in detail below.

Figure 3A:
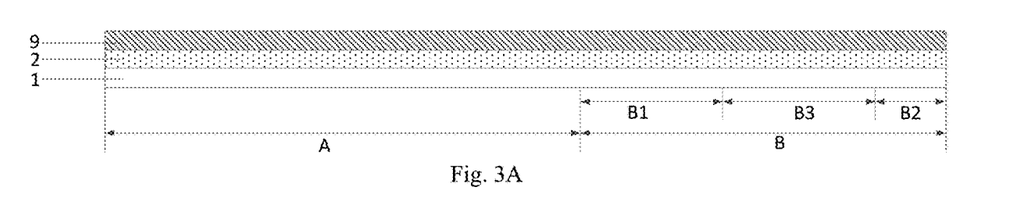
FIGS. 3A to 3P are schematic structural diagrams of a stretchable display panel shown in FIG. 1 after various steps are performed during preparation.

(1) A flexible substrate 2 and a barrier layer 9 are sequentially formed on a rigid substrate 1, as shown in FIG. 3A.

Figure 3B:
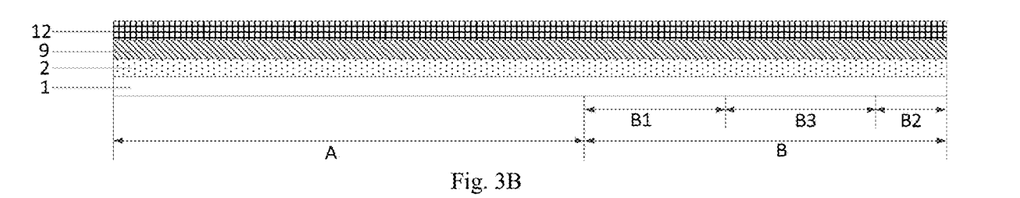

(2) A buffer layer 12 is formed on the barrier layer 9, as shown in FIG. 3B.

Figure 3C:
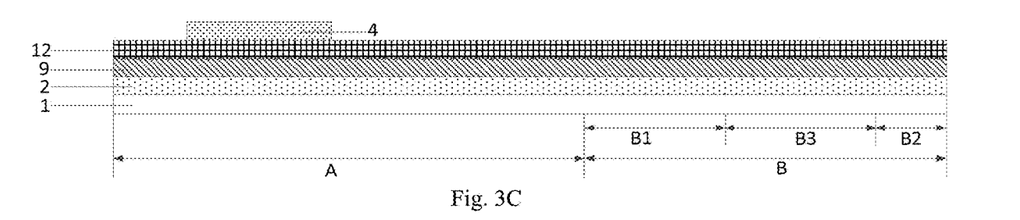

(3) An active layer 4 is formed on the buffer layer 12, as shown in FIG. 3C.

Figure 3D:
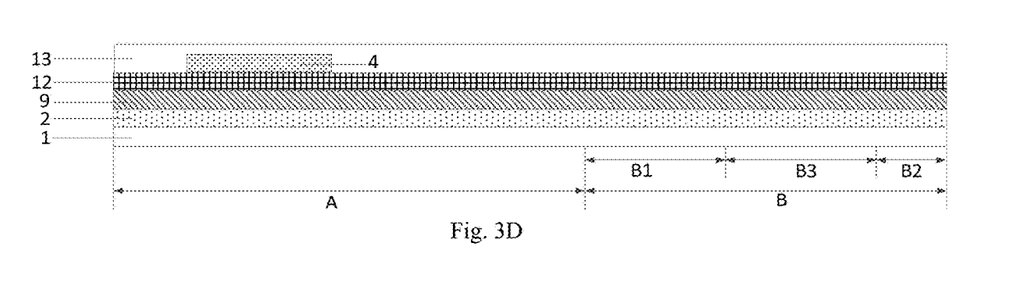

(4) A gate insulating layer 13 is formed on the active layer 4, as shown in FIG. 3D.

Figure 3E:
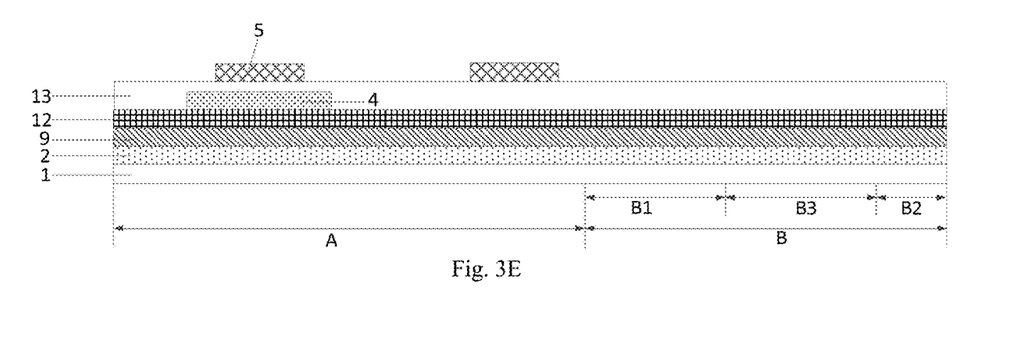

(5) A gate 5 is formed on the gate insulating layer 13 in a display area A, as shown in FIG. 3E.

Figure 3F:
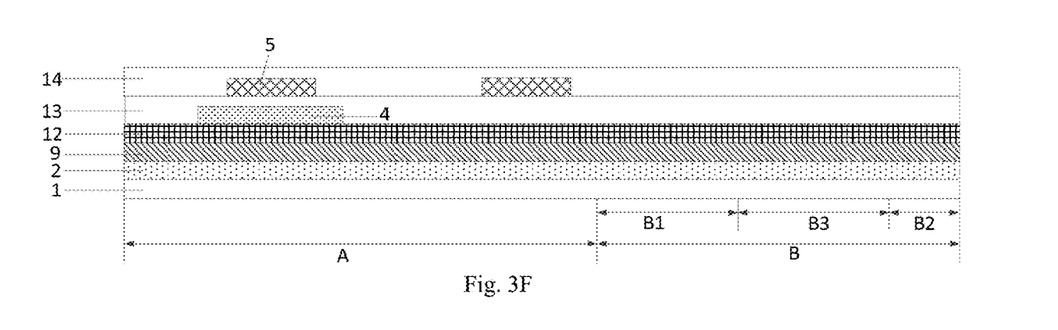

(6) A first insulating layer 14 is formed on the gate 5, as shown in FIG. 3F.

Figure 3G:
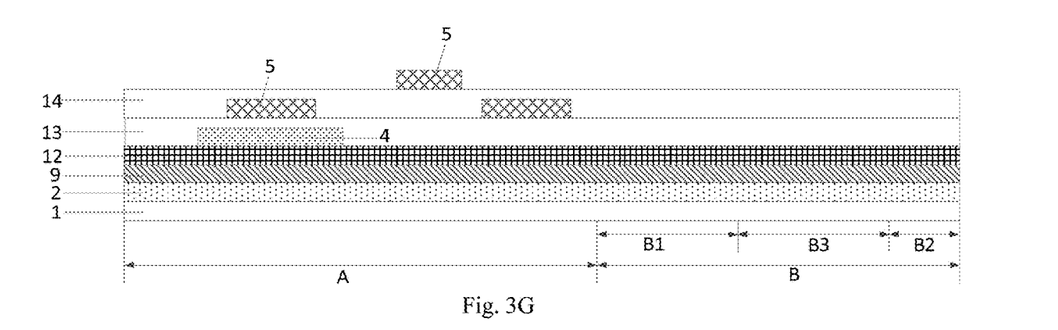

(7) Another gate 5 is formed on the first insulating layer 14, as shown in FIG. 3G.

Figure 3H:
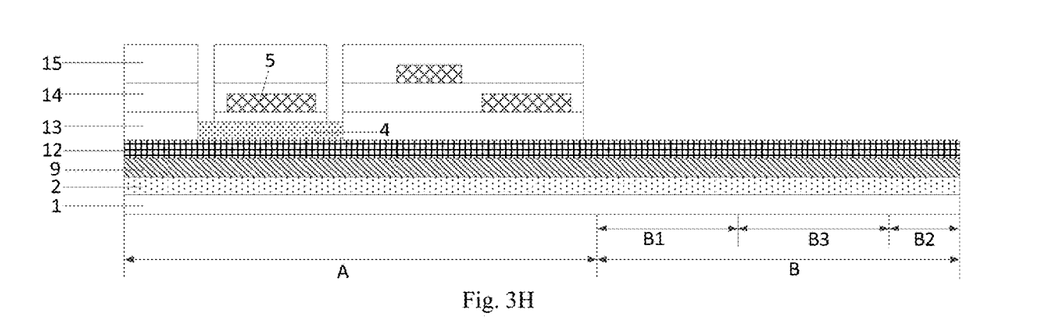

(8) A second insulating layer 15 is formed on another gate 5, and the gate insulating layer 13, the first insulating layer 14 and the second insulating layer 15 located in a non-display area B are etched away through an etching process, and then the gate insulating layer 13, and the first insulating layer 14 and the second insulating layer 15 located in the display area A are perforated to form via holes through which a source and a drain are electrically connected to the active layer 4, as shown in FIG. 3H.

Figure 3I:
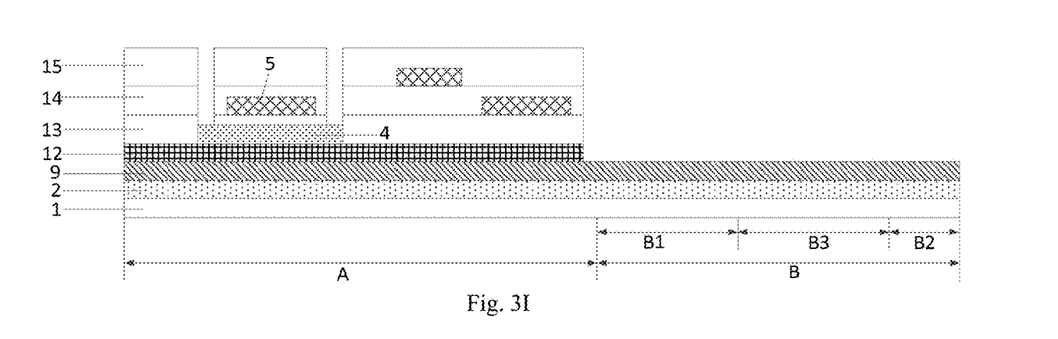

(9) The buffer layer 12 located in the non-display area B is etched away through an etching process, as shown in FIG. 3I.

Figure 3J:
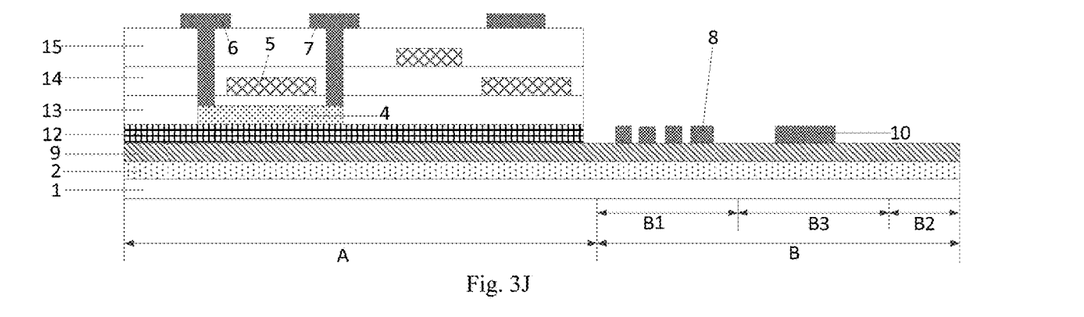

(10) Through a one-time patterning process, the source 6 and the drain 7 which are electrically connected to the active layer 4 are formed on the second insulating layer 15 in the display area A, wires 8 are formed in a wiring area B1, and a conductive part 10 is formed in an isolation area B3, as shown in FIG. 3J.

Figure 3K:
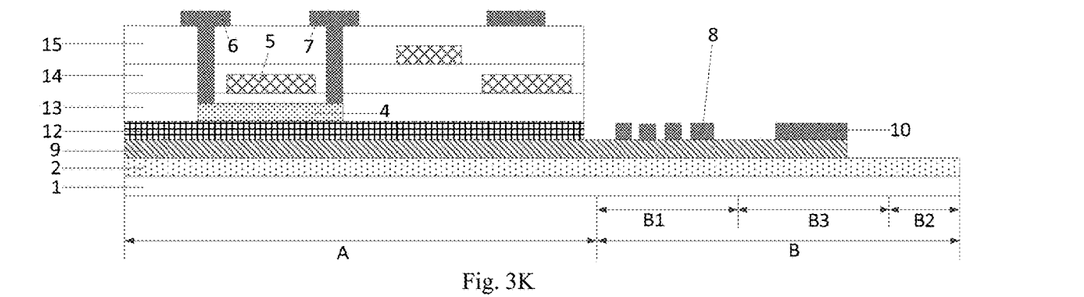

(11) The barrier layer 9 located in an opening area B2 is etched away through an etching process, as shown in FIG. 3K.

Figure 3L:
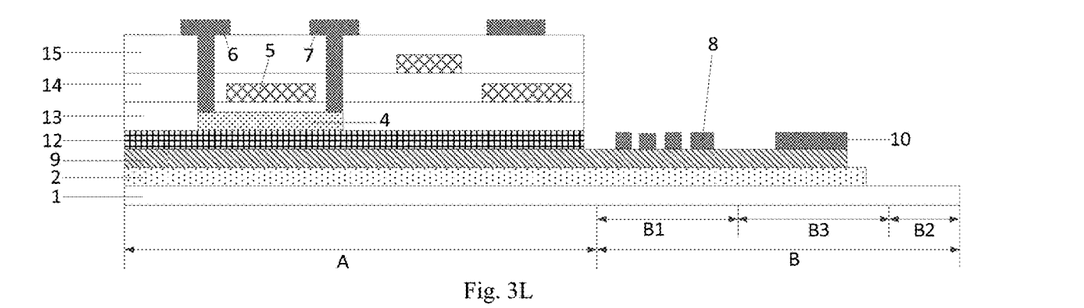

(12) The flexible substrate 2 located in the opening area B2 is etched away through an etching process, as shown in FIG. 3L.

Figure 3M:
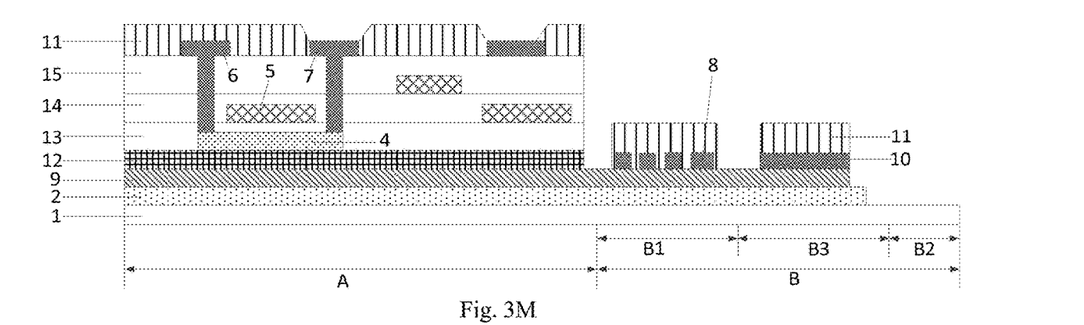

(13) A planarization layer 11 is formed over the source 6 and the drain 7 of the display area A, over the wires of the wiring area B1 and over the conductive part 10 of the isolation area B3, and the area, corresponding to the drain 7, of the planarization layer 11 is perforated through an etching process, as shown in FIG. 3M.

Figure 3N:
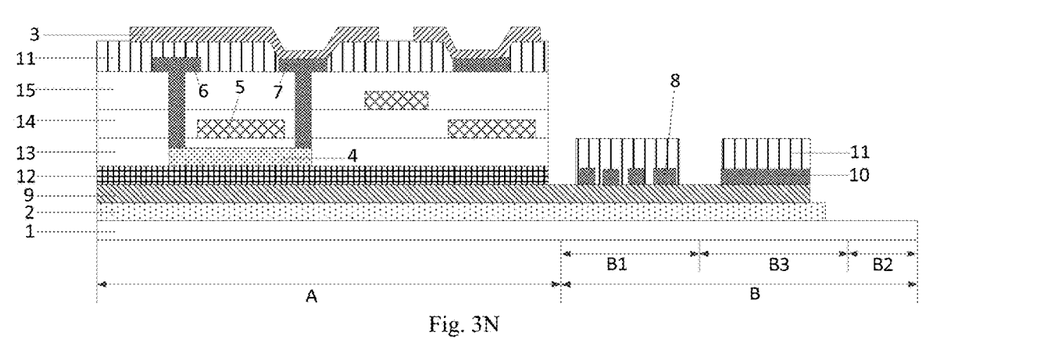

(14) An anode 3 coupled to the drain 7 is formed on the planarization layer 11 of the display area A, as shown in FIG. 3N.

Figure 3O:
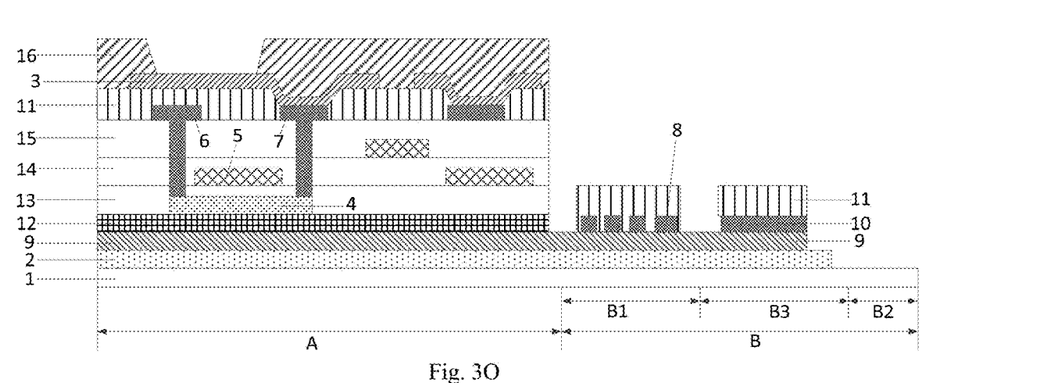

(15) A pixel defining layer 16 defining light-emitting devices of sub-pixels is formed on the anode 3 of the display area A, as shown in FIG. 3O.

Figure 3P:
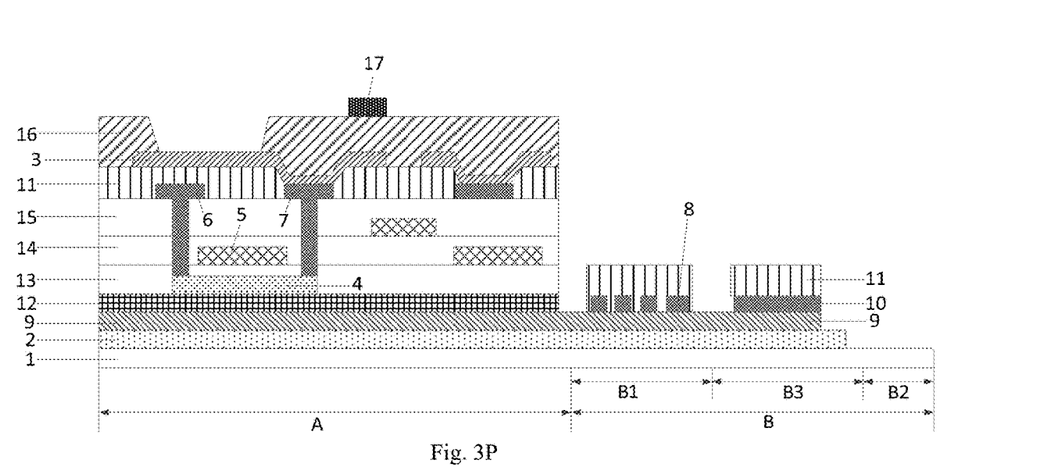

(16) A spacer layer 17 is formed on the pixel defining layer 16 of the display area A, as shown in FIG. 3P.

(17) The side surfaces of the conductive part 10 of the isolation area B3 is etched to form an inverted trapezoidal isolation pillar structure, the part, exposed between the isolation area B3 and the wiring area B1, of the barrier layer 9 is etched away, and the part, exposed between the wiring area B1 and the display area A, of the barrier layer 9 is etched away, as shown in FIG. 1.

Through the above steps (1) to (17), the stretchable display panel provided in FIG. 1 of the embodiment of the present disclosure can be formed.

It should be noted that in the above-mentioned manufacturing method provided by the embodiment of the present disclosure, the patterning process may only include a photolithography process, or may include a photolithography process and an etching step, and may also include printing, inkjet and other processes for forming predetermined patterns; the photolithography process refers to a pattern forming process including film formation, exposure, development and other procedures through photoresist, masks, exposure machines and so on. During specific implementation, the corresponding patterning processes can be selected according to structures formed in the present disclosure.

Based on the same inventive concept, an embodiment of the present disclosure further provides a display device which includes the above-mentioned stretchable display panel provided by the embodiments of the present disclosure. The principle of solving problems of the display device is similar to that of the aforementioned stretchable display panel, therefore the implementation of the display device may refer to the implementation of the aforementioned stretchable display panel, and is not described in detail herein.

During specific implementation, the display device is especially applicable to wearable devices such as bracelets.

According to the stretchable display panel and the display device which are provided by the embodiments of the present disclosure, the stretchable display panel includes: a flexible substrate which is divided into a plurality of display areas and non-display areas located between the display areas; wherein, the display areas include light-emitting devices and driving circuits coupled to the light-emitting devices; the non-display areas include wiring areas and a plurality of opening areas between the wiring areas, the wiring areas include wires coupled to the driving circuits, and the opening areas are of a hollow structure. The plurality of opening areas are formed in the non-display areas, and the flexible substrate in the opening areas is of a hollow structure, that is, no film layer is reserved in the opening areas, thus when the display panel is stretched, the display panel can be stretched in any direction, and thus the stretching effect of the display panel is improved.

Apparently, those skilled in the art can make various modifications and variations to the present disclosure without departing from the spirit and scope of the present disclosure. In this way, if these modifications and variations of the present disclosure fall within the scope of the claims of the present disclosure and equivalent technologies, the present disclosure also intends to include these modifications and variations.

What is claimed is:

1. A stretchable display panel, comprising:
a flexible substrate, comprising display areas and non-display areas located between the display areas, wherein each non-display area comprises wiring areas and opening areas located between the wiring areas, and each opening area comprises a hollow structure penetrating through the stretchable display panel in a thickness direction;
a plurality of sub-pixels, located in the display areas, wherein each sub-pixel comprises a light-emitting device and a driving circuit coupled to the light-emitting device; and
a plurality of wires, located in the wiring areas and coupled to the driving circuits;
wherein the wires comprise first wires and second wires, two adjacent display areas in a column are coupled by the first wires, and two adjacent display areas in a row are coupled by the second wires;
two first sides of the two adjacent display areas in a column are adjacent to each other, and the first wires are coupled to other sides of the two adjacent display areas in a column except the two first sides; and
two second sides of the two adjacent display areas in a row are adjacent to each other, and the second wires are coupled to other sides of the two adjacent display areas in a row except the two second sides.

2. The stretchable display panel according to claim 1, wherein the first wires are coupled to sides opposite to the first sides in the two adjacent display areas in a column; and the second wires are coupled to sides opposite to the second sides in the two adjacent display areas in a row.

3. The stretchable display panel according to claim 2, wherein the wiring areas comprise first wiring areas and second wiring areas, areas where the first wires coupled to the two adjacent display areas in a column are located are the first wiring areas, and areas where the second wires coupled to the two adjacent display areas in a row are located are second wiring areas; and
the first wiring areas corresponding to the display areas in two adjacent columns are arranged symmetrically, and the second wiring areas corresponding to the display areas in two adjacent rows are arranged symmetrically.

4. The stretchable display panel according to claim 3, wherein the opening areas comprise first opening areas and second opening areas, the first opening areas are formed between two adjacent first wiring areas in a row, and the second opening areas are formed between two adjacent second wiring areas in a column.

5. The stretchable display panel according to claim 4, wherein the first opening areas extend to areas between the first wiring areas and the adjacent second wiring areas and form "H"-shaped opening areas, and the second opening areas extend to areas between the second wiring areas and the adjacent first wiring areas and form "H"-shaped opening areas.

6. The stretchable display panel according to claim 5, wherein among every two adjacent "H"-shaped opening areas in a row direction and/or a column direction, one of the "H"-shaped opening areas is arranged in a vertical direction, and the other "H"-shaped opening area is arranged in a horizontal direction.

7. The stretchable display panel according to claim 6, wherein the "H"-shaped opening areas in the vertical direction and the "H"-shaped opening areas in the horizontal direction are alternately arranged in the row direction and/or the column direction.

8. The stretchable display panel according to claim 1, wherein the non-display areas further comprise isolation areas located between the wiring areas and the opening areas and surround the opening areas, and light-emitting functional layers comprised in the light-emitting devices are disconnected at edges of the isolation areas.

9. The stretchable display panel according to claim 8, wherein each isolation area comprises a barrier layer, a conductive part and a planarization layer which are sequentially stacked on the flexible substrate; and
- in a direction where the isolation areas point to the opening areas, a width of an orthographic projection of each conductive part on the flexible substrate is smaller than a width of an orthographic projection of each planarization layer on the flexible substrate.

10. The stretchable display panel according to claim 9, wherein in the direction where the isolation areas point to the opening areas, the width of the orthographic projection of the each conductive part on the flexible substrate is smaller than a width of an orthographic projection of each barrier layer on the flexible substrate.

11. The stretchable display panel according to claim 9, wherein each wiring area comprises the barrier layer, the wires and the planarization layer which are sequentially stacked on the flexible substrate; and
- each conductive part is arranged in the same layer as the wires.

12. The stretchable display panel according to claim 11, wherein in areas between the display areas and the wiring areas as well as between the wiring areas and the isolation areas, all film layers are not patterned and only the flexible substrate exists.

13. A display device, comprising a stretchable display panel, wherein the stretchable display panel comprises:
- a flexible substrate, comprising display areas and non-display areas located between the display areas, wherein each non-display area comprises wiring areas and opening areas located between the wiring areas, and each opening area comprises a hollow structure penetrating through the stretchable display panel in a thickness direction;
- a plurality of sub-pixels, located in the display areas, wherein each sub-pixel comprises a light-emitting device and a driving circuit coupled to the light-emitting device; and
- a plurality of wires, located in the wiring areas and coupled to the driving circuits;
- wherein the wires comprise first wires and second wires, two adjacent display areas in a column are coupled by the first wires, and two adjacent display areas in a row are coupled by the second wires;
- two first sides of the two adjacent display areas in a column are adjacent to each other, and the first wires are coupled to other sides of the two adjacent display areas in a column except the two first sides; and
- two second sides of the two adjacent display areas in a row are adjacent to each other, and the second wires are coupled to other sides of the two adjacent display areas in a row except the two second sides.

14. A stretchable display panel, comprising:
- a flexible substrate, comprising display areas and non-display areas located between the display areas, wherein each non-display area comprises wiring areas and opening areas located between the wiring areas, and each opening area comprises a hollow structure penetrating through the stretchable display panel in a thickness direction;
- a plurality of sub-pixels, located in the display areas, wherein each sub-pixel comprises a light-emitting device and a driving circuit coupled to the light-emitting device; and
- a plurality of wires, located in the wiring areas and coupled to the driving circuits;
- wherein the non-display areas further comprise isolation areas located between the wiring areas and the opening areas and surround the opening areas, and light-emitting functional layers comprised in the light-emitting devices are disconnected at edges of the isolation areas;
- each isolation area comprises a barrier layer, a conductive part and a planarization layer which are sequentially stacked on the flexible substrate; and
- in a direction where the isolation areas point to the opening areas, a width of an orthographic projection of each conductive part on the flexible substrate is smaller than a width of an orthographic projection of each planarization layer on the flexible substrate.

15. A display device, comprising the stretchable display panel according to claim 14.

\* \* \* \* \*